United States Patent [19]

Solomon et al.

[11] Patent Number: 4,544,439

[45] Date of Patent: Oct. 1, 1985

[54] SYSTEM FOR REPAIRING ELECTRICAL SHORT CIRCUITS BETWEEN PARALLEL PRINTED CIRCUITS

[75] Inventors: Joseph M. Solomon, Endwell; Kenneth J. Varker, Binghamton, both of N.Y.

[73] Assignee: International Business Machines Corporation, Armonk, N.Y.

[21] Appl. No.: 634,527

[22] Filed: Jul. 26, 1984

[51] Int. Cl.$^4$ .............. C23F 1/02; B44C 1/22; C03C 15/00; C03C 25/06

[52] U.S. Cl. .................. 156/626; 134/21; 134/22.18; 134/24; 134/41; 134/166 R; 134/198; 134/102; 156/640; 156/644; 156/646; 156/652; 156/345; 156/656; 156/902

[58] Field of Search .............. 29/852; 156/626, 640, 156/644, 646, 652, 656, 345, 901, 902; 134/21, 22.1, 22.16, 22.18, 24, 41, 102, 114, 166 R, 198, 199; 427/97

[56] References Cited

U.S. PATENT DOCUMENTS 3,861,981 1/1975 Loo .................. 156/345 X
4,344,809 8/1982 Wensink .................. 156/345
4,359,360 11/1982 Harris et al. .................. 156/345

Primary Examiner—William A. Powell
Attorney, Agent, or Firm—Mark Levy

[57] ABSTRACT

A system for cleaning a thru hole on a substantially planar electrical board. The electrical board has two major surfaces, upper and lower. A first gas and liquid transmission device is connected to the board to introduce etching gas and liquid into the thru hole. The device is adapted to surround the thru hole and seal the periphery thereof on one surface of the board. A second gas and liquid transmission device is connected to the board to remove the etching gas and liquid from the thru hole. This second device is adapted to surround the thru hole and seal the periphery thereof on the other surface of the board. A vacuum system is used to force gas and liquid to move through the thru hole from the first transmission device to the second transmission device, thereby etching and/or cleaning material from the thru hole.

In another embodiment of the present invention there are provided transmission devices that are adapted to surround a plurality of thru holes and seal the peripheries thereof on both surfaces of the board.

40 Claims, 4 Drawing Figures

SYSTEM FOR REPAIRING ELECTRICAL SHORT CIRCUITS BETWEEN PARALLEL PRINTED CIRCUITS

BACKGROUND OF THE INVENTION

The present invention relates to a system for cleaning thru holes in a printed circuit board and, more particularly, for repairing electrical short circuits on a printed circuit board.

The most rudimentary printed circuit board has a relatively stiff substrate, one surface of which supports an electrical circuit made of deposited conductive material, such as copper. Soon after single surface circuit boards were made and used, it became apparent that circuit density had to increase in order to adequately supply logic and power to all parts of more complex electronic systems. Accordingly, circuit board substrates were soon developed to support printed circuits on the upper as well as on the lower major substrate surfaces. The circuit planes were substantially parallel to one another.

As the sophistication of electrical circuits and printed circuit boards increased, designers began to consider electrically connecting selected terminals on an upper surface circuit to selected terminals on a lower surface circuit. In order to achieve this electrical connection between circuits on major surfaces of the board, viaduct holes (vias) were used. These vias or thru holes were drilled, punched or etched completely through the board, from the upper surface to the lower surface. Electrically conductive wires could then be inserted in the vias and connected to points or terminals on both circuits, thus forming the desired electrical interconnections. Alternatively, the walls of the thru holes could be plated with electrically conductive material to accomplish the same result. The latter technique has proved to be the more efficient and reliable for densely packed circuits with high resolution electrical lines.

As the sophistication of electronic circuitry continued to increase, multiple layers of circuitry were provided on, sometimes embedded in, one printed circuit board substrate. The latter technique is referred to as encapsulation. Thus, in addition to circuitry being provided on both major surfaces of the substrate, other layers of circuitry were disposed intermediate the major surfaces and substantially parallel thereto. In multiple layer circuit cards and boards, plated thru holes could still be used to electrically connect circuitry disposed on both major surfaces of the substrate.

In the course of manufacturing multilayer circuit boards, occasionally a short circuit occurs due to an intermediate conductive layer being inadvertently allowed to contact the plated wall portion of a via. Thus, although a point on a circuit located on the upper surface is designed to be electrically connected only to a point on a circuit located on the lower surface, for example, an intermediate layer of conductive material may short circuit this connection and cause anomalous operation, unexpected results or even serious damage.

Heretofore, repairing short circuits such as those hereinabove described required mechanical drilling of the thru holes to remove the conductive material with which their walls were plated. A non-conductive material was then introduced into the thru hole to fill part of the drilled area. The walls were then replated with conductive material to reestablish the desired electrical connection between circuits on the major surfaces of the substrate. Unfortunately, while this mechanical drilling process has generally proved to be effective in removing contaminants that cause short circuits, in the course of drilling, the diameter of the thru hole often increases. In order to ensure that all contaminants are removed, inevitably the thru holes are enlarged to a degree beyond that which is strictly required. Such over-enlargement often becomes unacceptable due to space limitations when hundreds of thru holes are provided on every square inch of circuit board surface.

Chemical processes for repairing short circuits near thru holes have heretofore not been generally used due to the difficulty in handling and controlling the flow of caustic etching compositions through relatively small diameter vias.

Vacuum systems have been used with etchants, but not for the purpose of cleaning thru holes and repairing electrical short circuits. U.S. Pat. Nos. 4,344,809 and 4,384,917, both issued to Wensink, teach the use of a jet etch apparatus and method for decapsulation of molded devices. An etchant solution flows through an etching block forming a jet spray that impinges upon a device to be decapsulated. The etchant solution is drawn through the etching block by means of suction created by a jet pump. Thus, epoxy is removed from an encapsulated chip but the electrical connections between the chip and printed circuits are not affected.

It would be advantageous to provide a system for chemically removing electrically conductive material from a thru hole.

It would also be advantageous for such a system to remove solder and copper from a plated thru hole without damage to adjacent networks.

It would further be advantageous to remove solder and copper from a plated thru hole without enlarging the hole.

It would further be advantageous to provide a system for chemically removing electrically conductive material from a plurality of thru holes simultaneously.

Moreover, it would be advantageous to repair short circuits that occur in multilayer printed circuit boards in the vicinity of thru holes.

SUMMARY OF THE INVENTION

In accordance with the present invention there is provided a system for cleaning a thru hole on a substantially planar electrical circuit board. The board has two major surfaces, upper and lower. A first gas and liquid transmission device is connected to the board to introduce etching gas and liquid into the thru hole. The transmission device is adapted to surround the thru hole and seal the periphery thereof on one surface of the board. A second gas and liquid transmission device is connected to the board to remove the etching gas and liquid from the thru hole. This second transmission device is adapted to surround the thru hole and seal the periphery thereof on the other surface of the board. A vacuum system is used to force gas and liquid to move through the thru hole from the first transmission device to the second transmission device, thereby etching and/or cleaning material from the thru hole.

In another embodiment of the present invention the two transmission devices are adapted to surround a plurality of thru holes and seal the peripheries thereof on both surfaces of the board so that more than one thru hole can be cleaned and more than one electrical short circuit repaired simultaneously.

BRIEF DESCRIPTION OF THE DRAWINGS

A complete understanding of the present invention may be obtained by reference to the accompanying drawings, when taken in conjunction with the detailed description thereof and in which.

DETAILED DESCRIPTION OF THE PREFERRED EMBODIMENT

Figure 1:
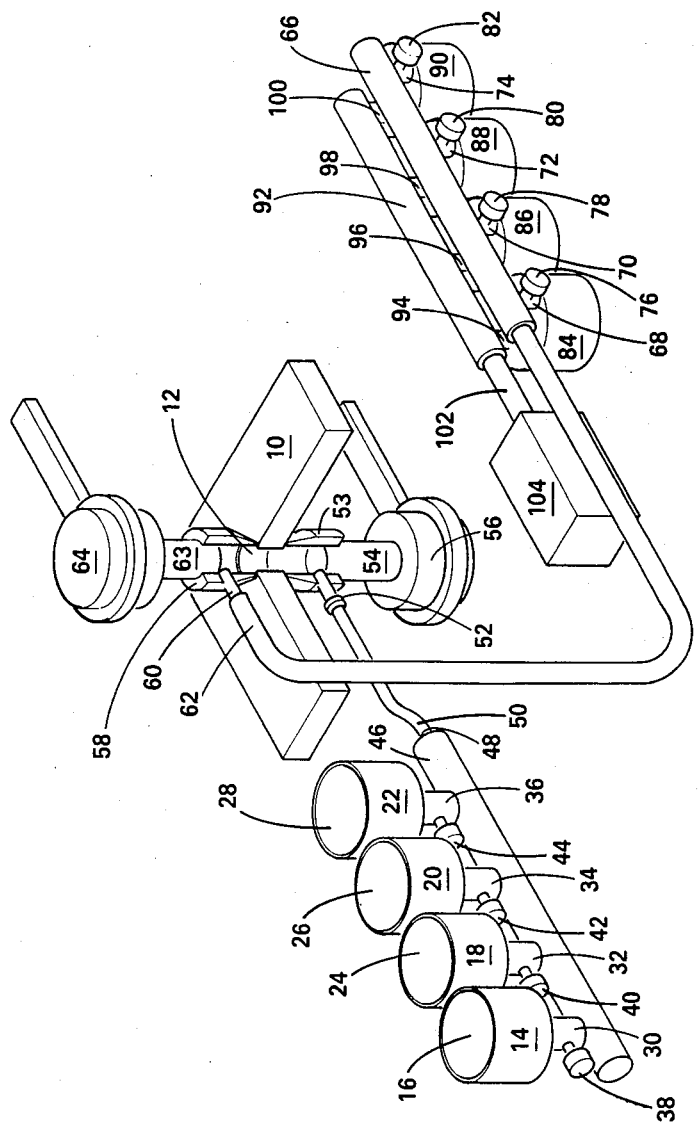
FIG. 1 is a perspective view, including a cross sectional view, of the system in accordance with the present invention.

Referring now to FIG. 1 there is shown a thru hole cleaning apparatus in accordance with the present invention. A circuit board 10, not drawn to scale, has thru holes or vias 12 drilled, punched or etched therethrough. A via 12 is shown in cross sectional view in this FIGURE, as is a portion of the circuit board 10. The walls of the vias 12 are plated with deposited copper or other electrically conductive metallic material to connect circuitry on the upper surface of the board 10 to circuitry on the lower surface thereof or to intermediate circuits, if any, embedded therein.

A container 14 has a reservoir of etchant 16. The etchant 16 chosen has a composition adapted to react with and dissolve the material with which the walls of the thru hole 12 is plated. When the plating material is copper, for example, the preferred etchant 16 is cupric chloride ($CuCl_2$). If, however, a gaseous etchant 16 is required, the container 14 must be completely enclosed with a suitable cover, not shown. Other containers 18, 20, 22 containing other liquid or gas chemical compositions 24, 26, 28 respectively, such as solvents, are also connected to the apparatus for purposes hereinbelow described. Container 18 is filled with a suitable solvent 24 for rinsing the residual etchant 16 from the via 12. When cupric chloride is used as an etchant 16, the preferred solvent 24 is water. The etchant solutions 16, 24, 26, 28 in any of the containers 14, 18, 20, 22 can be cupric chloride, as hereinabove mentioned, ammonium persulfate, ferric chloride or any other etchant that reacts with copper. These containers 14, 18, 20, 22 may alternatively contain solutions that react with tin and lead, the materials most commonly used in circuit board interconnection systems. It should be understood that any number of cannisters filled with corresponding gas or liquid compositions may be connected in parallel to the hole cleaning apparatus, depending upon the plating materials to be removed and the etchants and solvents required for those operations.

The reservoir containers 14, 18, 20, 22 are constructed of polypropylene in the preferred embodiment, but may be made of any other suitable material not expected to react with the chosen etchants 16, 24, 26, 28.

A hollow pipe or tube 30 is connected to the container 14 for removing the etchant 16 therefrom. Corresponding tubes 32, 34, 36 are similarly connected to the other containers 18, 20, 22 respectively for the same purpose. Connected to the tube 30 is an electrically controlled valve 38 for controlling the flow of the liquid or gas composition 16 from the container 14. The other tubes 32, 34, 36 are similarly equipped with electrically controlled valves 40, 42, 44 respectively, each of which can be operated individually and independently with respect to one another.

All valves used in the hole cleaning system are made of titanium, silicone rubber or low durometer Teflon material in the preferred embodiment. (Teflon is a registered trademark of E. I. du Pont de Nemours, Inc.) It should be understood, however, that any material having suitably compressible characteristics and being non-reactive with the etchants and solvents used would be acceptable for use as valves and seals.

An elongated hollow manifold 46 connects the tube 30, 32, 34, 36 associated with each container 14, 18, 20, 22 respectively and allows the contents of one or more of the containers to be accessed at a predetermined time.

The manifold 46 has an outlet port 48 at its far end, attached to which is another hollow pipe or tube 50. The tube 50 is connected to a hollow nozzle inlet member 52. The opposite end of the nozzle inlet member 52 is attached to a lower nozzle 53 in which is also inserted a hollow post 54. The post 54, in turn, is connected to a compressed air cylinder 56.

The lower nozzle 53 is forced to contact the lower surface of the circuit board 10 and in particular is pressed against the circuit board 10 by the use of pressurized air supplied by the compressed air cylinder 56 in such a way as to surround one and only one via 12 completely, forming a substantially air tight seal around the periphery thereof. It can be seen, therefore, that the diameter of the outlet portion of the lower nozzle 53 is greater than the diameter of the via 12.

Above the circuit board 10 is an upper nozzle 58, oppositely disposed to the lower nozzle 53 and pressed against the upper surface of the circuit board 10. It is pressed against the upper surface of the circuit board 10 in such a manner as to surround the via 12 completely, forming a substantially air tight seal around the periphery thereof. The upper nozzle 58 has a hollow nozzle outlet member 60 inserted therein. The nozzle outlet member 60 is attached to an exhaust pipe or hose 62 for removing the gas and liquid etchants and solvents from the via 12. Connected to the upper nozzle 58 is hollow post 63 which, in turn, is connected to another compressed air cylinder 64.

The exhaust hose 62 is connected to an elongated hollow waste manifold 66 with hoses 68, 70, 72, 74 being suitably connected thereto. The waste manifold 66 allows each of the hoses 68, 70, 72, 74 connected to it to be accessed individually at a predetermined time. Each of the hoses 68, 70, 72, 74 has a corresponding electrically controlled valve 76, 78, 80, 82 respectively associated with it, individually and independently operable to regulate the flow of liquid or gas therethrough. The outlets of the hoses 68, 70, 72, 74 are positioned to direct waste material into corresponding waste containers 84, 86, 88, 90 respectively. The waste containers 84, 86, 88, 90 facilitate closed loop system operation, as hereinbelow described, to recycle etchant and solvent liquid or gas chemicals until contamination eventually renders them useless.

An elongated, hollow vacuum manifold 92 is also provided to distribute a vacuum through selected waste containers 84, 86, 88, 90 to draw etchants and solvents through the via 12 from their respective container reservoirs 14, 18, 20, 22. The vacuum manifold 92 has hoses 94, 96, 98, 100 connected thereto which are positioned in corresponding waste containers 84, 86, 88, 90 respectively.

Connected to the outlet of the vacuum manifold 92 is a vacuum transfer pipe 102 which, in turn, is connected to a suitable vacuum pump 104. The vacuum pump 104 is capable of operating at a capacity of 2 standard cubic feet per minute (SCFM) at 90 psi.

The manifolds 46, 66, 92 are adapted to distribute either liquids or gases. Thus, the connections to their ports are all air tight.

Figure 2:
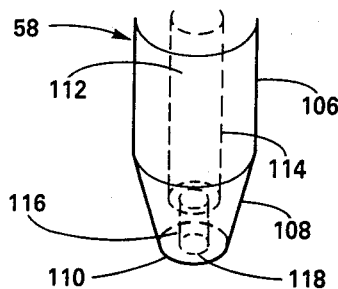
FIG. 2 is an exploded cross sectional view of a nozzle.

Referring now also to FIG. 2 there is shown an exploded cross sectional view of the upper nozzle 58. It should be understood that the lower nozzle 53 (FIG. 1) is constructed identically to the upper nozzle 58 but oriented oppositely thereto. The nozzle 58 is constructed of titanium, silicone rubber or low durometer Teflon material. The nozzle 58 has substantially vertical walls 106 which are tapered inwardly 108 to form a smaller, round outlet hole or aperture 110. In the preferred embodiment the outside diameter of the nozzle outlet hole 110 is 0.075 inches and the inside diameter thereof is 0.025 inches. Inside the nozzle 58 a viaduct 112 is cut with a diameter of 1/16 inch. Interior viaduct walls 114 are drilled in the nozzle 58 almost completely through. A smaller concentric portion 116 of the nozzle 58 is cut out, however, to form a concentric hole 118 with 0.025 inch diameter at the tip of the nozzle 58. A typical thru hole has a diameter of between 0.030 and 0.060 inches.

Figure 3:
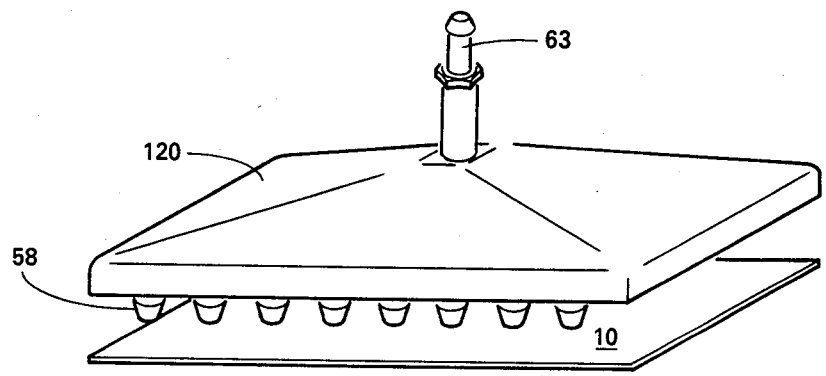
FIG. 3 is a perspective view of a portion of an alternative embodiment of the present invention.

Referring now also to FIG. 3 there is shown an alternative embodiment including an upper housing 120 for containing a plurality of upper nozzles 58, all of which upper nozzles 58 are identical to the upper nozzle 58 (FIG. 2) hereinabove described. The upper nozzles 58 are oriented on the housing 120 in such a manner as to correspond to the thru holes or vias 12 (FIG. 1) in the circuit board 10. In this alternative embodiment, it is contemplated that the thru holes 12 are formed in a regular grid pattern, but it should be understood that any pattern incorporating a plurality of thru holes can be utilized with an appropriate modification of the housing 120 and spacing of the nozzles 58. Moreover, a lower housing, not shown, with a plurality of lower nozzles corresponding to the aforementioned upper housing 120 must be used for proper system operation.

Figure 4:
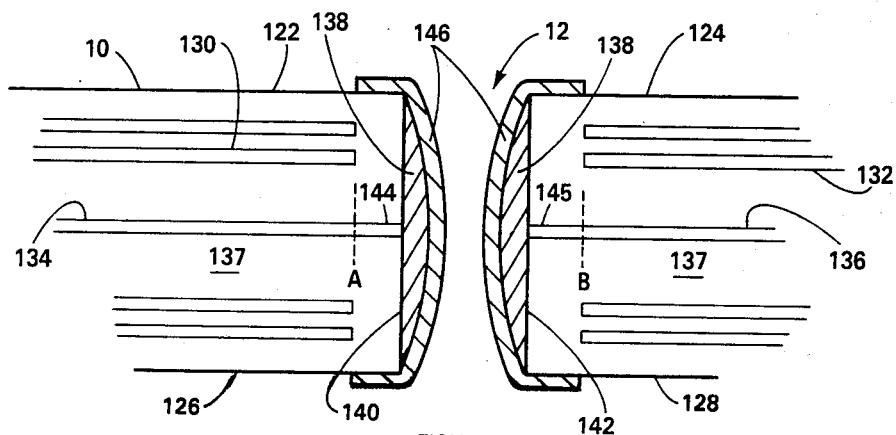
FIG. 4 is an exploded cross sectional schematic view of a thru hole.

Referring now also to FIG. 4 there is shown an exploded cross sectional view of a thru hole 12. On the upper surface of the circuit board 10 is circuitry 122, 124. On the lower surface of the circuit board 10 is additional circuitry 126, 128. Intermediate circuits 130, 132, 134, 136 are also identified in this FIGURE. It should be understood, however, that a greater number of intermediate circuits may be provided between the upper circuit 122, 124 and the lower circuit 126, 128 and substantially parallel thereto depending upon the requirements of the system of which the circuit board 10 is a part. No intermediate circuits need be provided, however, in a circuit board for the present invention to be used merely as a via cleaning system, as opposed to an electrical short circuit repairing system.

Electrically non-conductive substrate material, such as epoxy-glass having a suitably high dielectric constant, is used to separate the circuits from one another. Such substrate material is identified by reference numeral 137.

Electrically conductive material 138 such as copper in the preferred embodiment plates the walls 140, 142 of the thru hole 12. This electrically conductive material 138 may interconnect the surface circuitry 122, 124 and 126, 128 and/or any of the intermediate circuits 130, 132, 134, 136 with one another or with the surface circuitry. It can be seen that intermediate circuit 130 is not connected to the plating material 138 covering the wall 140, but that intermediate circuit 134 is connected to the plating material 138 covering one wall 138 of the thru hole 12. As hereinbelow described, during the etching phase of the process the plated material 138 on the walls 140, 142 is etched as is the part of the intermediate circuits 134, 136 bounded by phantom lines A and B and shown as reference numerals 144, 145. This technique is called etchback.

The plating material 138 that covers the walls 140, 142 of the thru hole 12 is itself covered by an outermost layer of conductive material 146, such as tin, tin-bismuth or tin-lead in the preferred embodiment, or any lead composition as is normally found in solder compositions. During the steps of the etching process, the outermost layer of tin-lead material 146 is first etched away and then the innermost layer of copper 138 is etched, as well as the portions 144, 145 of the intermediate circuits 134, 136 proximate the thru hole wall 140.

In operation, the compressed air cylinders 56, 64 are energized with compressed air to move the respective nozzles 53, 58 against the circuit board 10. To determine that the compressed air cylinders 56, 64 are leakproof, the vacuum pump 104 is turned on and a solvent 28 is introduced into the hole cleaning system and through a via 12 so that a test can be performed. In the preferred embodiment, containers 14, 18, 20, 22 are filled with cupric chloride, water, tin-lead etchant and water respectively. The corresponding waste containers are shown at reference numerals 84, 86, 88 and 90 respectively. Appropriate valves 44, 76 are opened and all others are closed. The vacuum pump 104 draws the solvent 28 through hose 30, manifold 46, tube 50, lower nozzle 53, thru hole 12, upper nozzle 58, hose 62, waste manifold 66 and into waste container 84.

Upon determining that no leak exists, the first tin-lead etchant 16 is introduced through the thru hole 12 to remove the outer coating 146 of the walls 140, 142 thereof. Appropriate valves 38, 78 are opened and all others are closed. In the preferred embodiment, the via walls 140, 142 have an outer layer of solder comprising a tin-lead composition. The etchant 16 to remove tin-lead is vacuum drawn through the manifold 46, hose 50, lower nozzle 53, plated thru hole 12, upper nozzle 58, hose 62, waste manifold 66 and into waste container 86 until all the tin-lead 146 has been removed. Thereafter, water 24 is transferred through the manifold 46 and thence through the plated thru hole 12 so that the etchant 16 for removing tin-lead is rinsed thoroughly. The above mentioned rinsing operation requires that valves 32, 80 be opened and all others be closed.

A solution of cupric chloride 26 is vacuum drawn through the thru hole 12 by the aforementioned path to remove the layer of plated copper 138 therefrom. This copper 138 is not only plated on the walls 140, 142 but also forms an unwanted electrical interconnection 144, 145 internal to the board laminate. Chemical etching of the encapsulated copper 144, 145 proceeds until it is etched back to phantom lines A and B respectively.

Upon removal of these metallic substances 138, 146, 144, 145 from the walls 140, 142 and from the intermediate circuits 134, 136, a solvent 28 is drawn through the thru hole 12 by the aforementioned path to remove the residual etchant materials 26. Water is the preferred solvent 28 and is drawn through the thru hole 12 and deposited in waste container 90 until the via 12 is clean. Acetone or alcohol may be introduced after rinsing. Air is then drawn through the thru hole 12 until the area is dry. The vacuum is still maintained by the vacuum pump 104. The lower nozzle 53 is separated from the board 10 so that air can be drawn through to dry the plated thru hole 12 of residual solvent 28.

A suitable device, not shown, such as an ionometer, may be used to detect the endpoint of the etching process. After all metal has been removed from the plated thru hole 12 and the hole 12 has been thoroughly cleaned, the upper and lower nozzles 58, 53 are separated and the board 10 removed therefrom. A non-conductive material such as epoxy-glass 137 is inserted into the thru hole 12. In the preferred embodiment, the non-conductive material is epoxy, but any material electrically compatible with the substrate 137 and having a similar dielectric constant can be used.

If an electrical connection between the surface circuitry 122, 126 and 124, 128 is desired, the thru hole 12 is replated with copper 138 and optionally tin-lead 146 to connect circuitry on both surfaces of the circuit board 10 but not the intermediate circuits. Similarly, an electrically conductive pin, not shown, may be inserted in the thru hole and its ends suitably connected to circuits on the major substrate surfaces 122, 126 and 124, 128 to form electrical connections.

It should be understood that with suitable modifications to the apparatus hereinabove described, the vacuum pump 104 may also be used to draw etchants and solvents from containers 84, 86, 88, 90 to containers 14, 18, 20, 22, if desired.

Although the present invention has been described in connection with a particular embodiment and operational scheme, it is to be expressly understood that the modifications and alterations which may be made by those having ordinary skill in the art are numerous and do not depart from the spirit and scope of the claimed invention. One of the particular advantages of the present invention is its flexibility and adaptability to operate not only in the manner as illustrated, but to be capable of operating in a large number of ways without departing from the basic teachings set forth above.

What is claimed is:

1. A system for cleaning a thru hole on a substantially planar electrical board having two major surfaces comprising:
   (a) first gas and liquid transmission means operatively connected to the board to introduce gas and liquid into the thru hole, said first means being adapted to surround the thru hole and seal the periphery thereof on one of said major surfaces of the board;
   (b) second gas and liquid transmission means operatively connected to said board to remove gas and liquid from the thru hole, said second means being adapted to surround the thru hole and seal the periphery thereof on the other of said major surfaces of the board; and
   (c) means for directly forcing gas and liquid to move through the thru hole from said first gas and liquid transmission means to said second gas and liquid transmission means.

2. The system in accordance with claim 1 wherein said second gas and liquid transmission means comprises a nozzle.

3. The system in accordance with claim 2 wherein said second gas and liquid transmission means comprises means for applying pressure to said nozzle.

4. The system in accordance with claim 3 wherein said means for applying pressure is a hydraulic device.

5. The system in accordance with claim 3 wherein said means for applying pressure is a pneumatic device.

6. The system in accordance with claim 3 wherein said means for applying pressure is a mechanical device.

7. The system in accordance with claim 1 further comprising reservoir means operatively connected to said first gas and liquid transmission means for receiving used liquid.

8. The system in accordance with claim 7 wherein said reservoir means is used for storing said used liquid.

9. The system in accordance with claim 7 wherein said reservoir means is used for treating said used liquid.

10. The system in accordance with claim 1 wherein said first gas and liquid transmission means and said second gas and liquid transmission means are adapted to be used with an etchant for etching material from said thru hole.

11. The system in accordance with claim 10 wherein said etchant is adapted to etch metal.

12. The system in accordance with claim 11 wherein said etchant is adapted to etch copper.

13. The system in accordance with claim 1 wherein said forcing means is a pumping device.

14. The system in accordance with claim 1 wherein said forcing means is a vacuum device.

15. The system in accordance with claim 10 further comprising means for detecting the endpoint of said metal etching.

16. The system in accordance with claim 15 wherein said means for detecting the endpoint is an ionometer.

17. Apparatus for cleaning a plurality of thru holes on a substantially planar electrical board having two major surfaces comprising:
   (a) first gas and liquid transmission means operatively connected to the board to introduce gas and liquid into said plurality of thru holes, said first means being adapted to surround a predetermined number of thru holes and seal the periphery thereof on one of said major surfaces of the board;
   (b) second gas and liquid transmission means operatively connected to said board to remove gas and liquid from said predetermined number of thru holes, said second means being adapted to surround said thru holes and seal the periphery thereof on the other of said major surfaces of the board; and
   (c) means for directly forcing gas and liquid to move through said predetermined number of thru holes simultaneously from said first gas and liquid transmission means to said second gas and liquid transmission means.

18. The apparatus in accordance with claim 17 wherein said second gas and liquid transmission means comprises a plurality of nozzles.

19. The apparatus in accordance with claim 18 further comprising a manifold operatively connected to said plurality of nozzles for distributing gas and liquid therethrough.

20. The apparatus in accordance with claim 19 wherein said first gas and liquid transmission means comprises a plurality of nozzles.

21. The apparatus in accordance with claim 20 further comprising a second manifold operatively connected to said plurality of nozzles for distributing gas and liquid therethrough.

22. A method for eliminating short circuits on electrical circuitry interconnected by a hole being plated with a layer of electrically conductive material on an electrical board, the steps comprising:
   (a) introducing an etchant into the hole to remove the layer of metal therefrom;
   (b) vacuum removing said etchant from said hole;
   (c) introducing a solvent into said hole to rinse residual etchant therefrom;
   (d) vacuum removing said solvent from said hole;
   (e) drying said hole; and
   (f) introducing a non-conducting material into the hole to seal exposed internal conductive material.

23. The method in accordance with claim 22, the steps further comprising detecting the endpoint of metal removal prior to introducing said solvent into said hole.

24. The method in accordance with claim 23 wherein said detection of the endpoint of metal removal is accomplished by the use of an ionometer.

25. The method in accordance with claim 22 wherein said non-conducting material is an epoxy-glass composition.

26. The method in accordance with claim 22 wherein said drying is accomplished by introducing a gas into said hole.

27. The method in accordance with claim 22 wherein said drying is accomplished by introducing a liquid into said hole.

28. The method in accordance with claim 27 wherein said liquid comprises acetone.

29. The method in accordance with claim 27 wherein said liquid comprises alcohol.

30. A method for eliminating short circuits on electrical circuitry interconnected by a hole being plated with a layer each of two electrically conductive materials on an electrical board, the steps comprising:
   (a) introducing a first etchant into the hole to remove the first layer of conductive material therefrom;
   (b) introducing a first solvent into said hole to rinse residual first etchant therefrom;
   (c) introducing a second etchant into the hole to remove a portion of the second layer of conductive material therefrom;
   (d) introducing a second solvent into said hole to rinse residual second etchant therefrom;
   (e) drying said hole; and
   (f) introducing a non-conducting material into the hole to seal exposed internal conductive material.

31. The method in accordance with claim 30 wherein said first etchant is adapted to etch solder.

32. The method in accordance with claim 30 wherein said second etchant is adapted to etch copper.

33. The method in accordance with claim 30 wherein said non-conducting material comprises an epoxy-glass composition.

34. The method in accordance with claim 30, the steps further comprising placing a conductive material in the hole before the sealing thereof.

35. The method in accordance with claim 34 wherein said conductive material comprises a pin.

36. A method for disconnecting vertical conductors between horizontal conducting planes in an electrical interconnection structure comprising:
   (a) bringing a first material into contact with said vertical conductors to effect etching thereof;
   (b) vacuum removing said first material;
   (c) bringing a second material into contact with said vertical conductors to rinse residual first material therefrom;
   (d) vacuum removing said said second material;
   (e) drying the immediate area; and
   (f) bringing a non-conducting material into contact to seal exposed internal conductive material.

37. The method in accordance with claim 36 wherein said first material is an etchant.

38. The method in accordance with claim 37 wherein said second material is a solvent.

39. The method in accordance with claim 38 wherein said vertical conductors form vias in said electrical board.

40. The method in accordance with claim 39 wherein said first and second materials and the steps of vacuum removing them are performed with the use of a manifold having a plurality of nozzles attached thereto.

* * * * *